(12) United States Patent
Yew et al.

(10) Patent No.: US 10,685,920 B2
(45) Date of Patent: Jun. 16, 2020

(54) SEMICONDUCTOR DEVICE PACKAGE WITH WARPAGE CONTROL STRUCTURE

(71) Applicant: TAIWAN SEMICONDUCTOR MANUFACTURING CO., LTD., Hsinchu (TW)

(72) Inventors: Ming-Chih Yew, Hsinchu (TW); Fu-Jen Li, Hsinchu (TW); Po-Yao Lin, Hsinchu County (TW); Kuo-Chuan Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/823,474

(22) Filed: Nov. 27, 2017

(65) Prior Publication Data

US 2018/0082961 A1    Mar. 22, 2018

Related U.S. Application Data

(63) Continuation of application No. 14/151,217, filed on Jan. 9, 2014, now Pat. No. 9,831,190.

(51) Int. Cl.
| | |
|---|---|
| *H01L 23/00* | (2006.01) |
| *H01L 23/36* | (2006.01) |
| *H01L 23/40* | (2006.01) |
| *H01L 23/31* | (2006.01) |

(52) U.S. Cl.
CPC .......... *H01L 23/562* (2013.01); *H01L 23/36* (2013.01); *H01L 23/3128* (2013.01); *H01L 23/40* (2013.01); *H01L 2224/16225* (2013.01); *H01L 2224/32225* (2013.01); *H01L 2224/73204* (2013.01); *H01L 2224/73253* (2013.01); *H01L 2924/0002* (2013.01); *H01L 2924/15311* (2013.01); *H01L 2924/3511* (2013.01)

(58) Field of Classification Search
CPC ... H01L 23/562; H01L 23/36; H01L 23/3128; H01L 23/40; H01L 23/2224; H01L 23/32225; H01L 23/16225; H01L 23/3204; H01L 23/73253; H01L 23/15311; H01L 23/3511
See application file for complete search history.

(56) References Cited

U.S. PATENT DOCUMENTS

| | | | |
|---|---|---|---|
| 4,034,468 | A | 7/1977 | Koopman |
| 6,146,921 | A | 11/2000 | Barrow |
| 6,243,944 | B1 | 6/2001 | Tustaniwskyj et al. |
| 6,261,404 | B1 * | 7/2001 | Baska ............... H01L 21/4871 |
| | | | 156/310 |

(Continued)

FOREIGN PATENT DOCUMENTS

| | | |
|---|---|---|
| CN | 101728340 A | 6/2010 |
| JP | H05206320 A | 8/1993 |

(Continued)

*Primary Examiner* — David A Zarneke
(74) *Attorney, Agent, or Firm* — Maschoff Brennan

(57) ABSTRACT

Between an adhesive surface of a heat spreader lid and a top surface of a semiconductor package, in addition to a spreader adhesive layer, several warpage control adhesive layers are also provided. The warpage control adhesive layers are disposed on corner areas of the adhesive surface of the heat spreader lid to reduce high temperature warpage of the semiconductor device package.

20 Claims, 4 Drawing Sheets

(56) References Cited

U.S. PATENT DOCUMENTS

| | | | |
|---|---|---|---|
| 6,315,038 B1 * | 11/2001 | Chiu | H01L 23/3737 165/185 |
| 6,396,700 B1 | 5/2002 | Chu et al. | |
| 6,486,562 B1 * | 11/2002 | Kato | H01L 21/563 257/712 |
| 6,748,350 B2 | 6/2004 | Rumer et al. | |
| 6,949,404 B1 | 9/2005 | Fritz et al. | |
| 7,025,129 B2 * | 4/2006 | Chiu | H01L 23/3737 165/185 |
| 7,679,184 B2 * | 3/2010 | Kusano | H01L 21/565 257/712 |
| 7,728,440 B2 | 6/2010 | Honda | |
| 8,334,591 B2 * | 12/2012 | Kusano | H01L 21/565 257/706 |
| 8,614,517 B2 * | 12/2013 | Yasukawa | H01L 21/563 257/790 |
| 8,901,732 B2 * | 12/2014 | Yew | H01L 23/4334 257/706 |
| 8,981,550 B2 | 3/2015 | Park et al. | |
| 9,041,192 B2 | 5/2015 | Saeidi et al. | |
| 2003/0058620 A1 | 3/2003 | Rumer et al. | |
| 2003/0230800 A1 | 12/2003 | Akai | |
| 2004/0065410 A1 | 4/2004 | Gektin et al. | |
| 2005/0139994 A1 * | 6/2005 | Hsu | H01L 23/3128 257/706 |
| 2007/0126113 A1 | 6/2007 | Ohkubo et al. | |
| 2007/0278667 A1 | 12/2007 | Kusano et al. | |
| 2008/0128887 A1 | 6/2008 | Hayashi | |
| 2010/0013089 A1 | 1/2010 | So et al. | |
| 2010/0096747 A1 | 4/2010 | Kusano | |
| 2010/0219524 A1 * | 9/2010 | Shen | H01L 21/56 257/690 |
| 2010/0230797 A1 | 9/2010 | Honda | |
| 2011/0169155 A1 | 7/2011 | Ogihara | |
| 2012/0074588 A1 | 3/2012 | Hsiao et al. | |
| 2012/0119372 A1 | 5/2012 | Yasukawa | |
| 2012/0153453 A1 | 6/2012 | Ankireddi et al. | |
| 2013/0093074 A1 | 4/2013 | Grant | |
| 2013/0208426 A1 | 8/2013 | Kim et al. | |
| 2013/0292684 A1 | 11/2013 | Nikitin et al. | |
| 2014/0048951 A1 | 2/2014 | Lin et al. | |
| 2014/0061893 A1 * | 3/2014 | Saeidi | H01L 23/16 257/712 |
| 2014/0084446 A1 | 3/2014 | Park | |
| 2014/0213018 A1 | 7/2014 | Higgins, III et al. | |
| 2014/0264815 A1 | 9/2014 | Yew et al. | |
| 2015/0035134 A1 | 2/2015 | Hung et al. | |
| 2015/0145115 A1 | 5/2015 | Liu et al. | |
| 2015/0187679 A1 | 7/2015 | Ho et al. | |

FOREIGN PATENT DOCUMENTS

| | | |
|---|---|---|
| JP | 3189270 B2 | 7/2001 |
| JP | 3374812 B2 | 2/2003 |

* cited by examiner

| Examples | warpage control pattern* | Spreader adhesive layer coverage | Warpage control adhesive layers | Predicted warpage at 260 °C** |
|---|---|---|---|---|
| CE1 | (240) | 100% | No | 1.00 |
| CE2 | (240) | 80% | No | 1.11 |
| CE3 | (240) | 60% | No | 1.06 |
| CE4 | (240) | 50% | No | 0.92 |
| CE5 | (241, 240) | 50% | No | 1.00 |
| CE6 | (241, 240) | 50% | No | 0.89 |
| E1 | (242, 240) | 50% | Yes | 0.81 |
| E2 | (242, 240) | 50% | Yes | 0.87 |
| E3 | (242, 240) | 50% | Yes | 0.85 |

* Ony 1/4 of the warpage control pattern is shown.
** The crying warpage of CE1 is simulated by finite element analysis (FEA) and is normalized to 1.

Fig. 2A

SEMICONDUCTOR DEVICE PACKAGE WITH WARPAGE CONTROL STRUCTURE

PRIORITY CLAIM AND CROSS-REFERENCE

The present application is a continuation application of U.S. patent application Ser. No. 14/151,217, filed Jan. 9, 2014, which is herein incorporated by reference in its entirety.

BACKGROUND

In semiconductor device package assembly, a semiconductor die (also referred to as an integrated circuit (IC) chip or "chip") may be bonded directly to a packaging substrate. Such die is formed with bumps of solder affixed to its I/O bonding pads. During packaging, the die is "flipped" onto its front surface (e.g., active circuit surface) so that the solder bumps form electrical and mechanical connections directly between the die and conductive metal pads on the packaging substrate. Underfill is generally applied between the gap formed by the solder bumps in order to further secure the die to the packaging substrate. A semiconductor device package of this type is commonly called a "flip chip package."

In addition, a heat spreader may further attached over the die and packaging substrate to enhance the heat dissipation ability of the flip chip package. A problem with such a flip chip package is that it is subject to different temperatures during the packaging process. For instance, different temperatures arise with the cool down from the solder joining temperature and the underfill curing temperature. As a result, the package is highly stressed due to the different coefficients of thermal expansion (CTE) of the various package and die materials. The high stress experienced by bonded materials during heating and cooling may cause them to warp or crack and cause the package structure to bow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a table listing simulation results of warpage of a semiconductor device package with a heat spreader lid at 260° C. by finite element analysis.

Figure 1A:
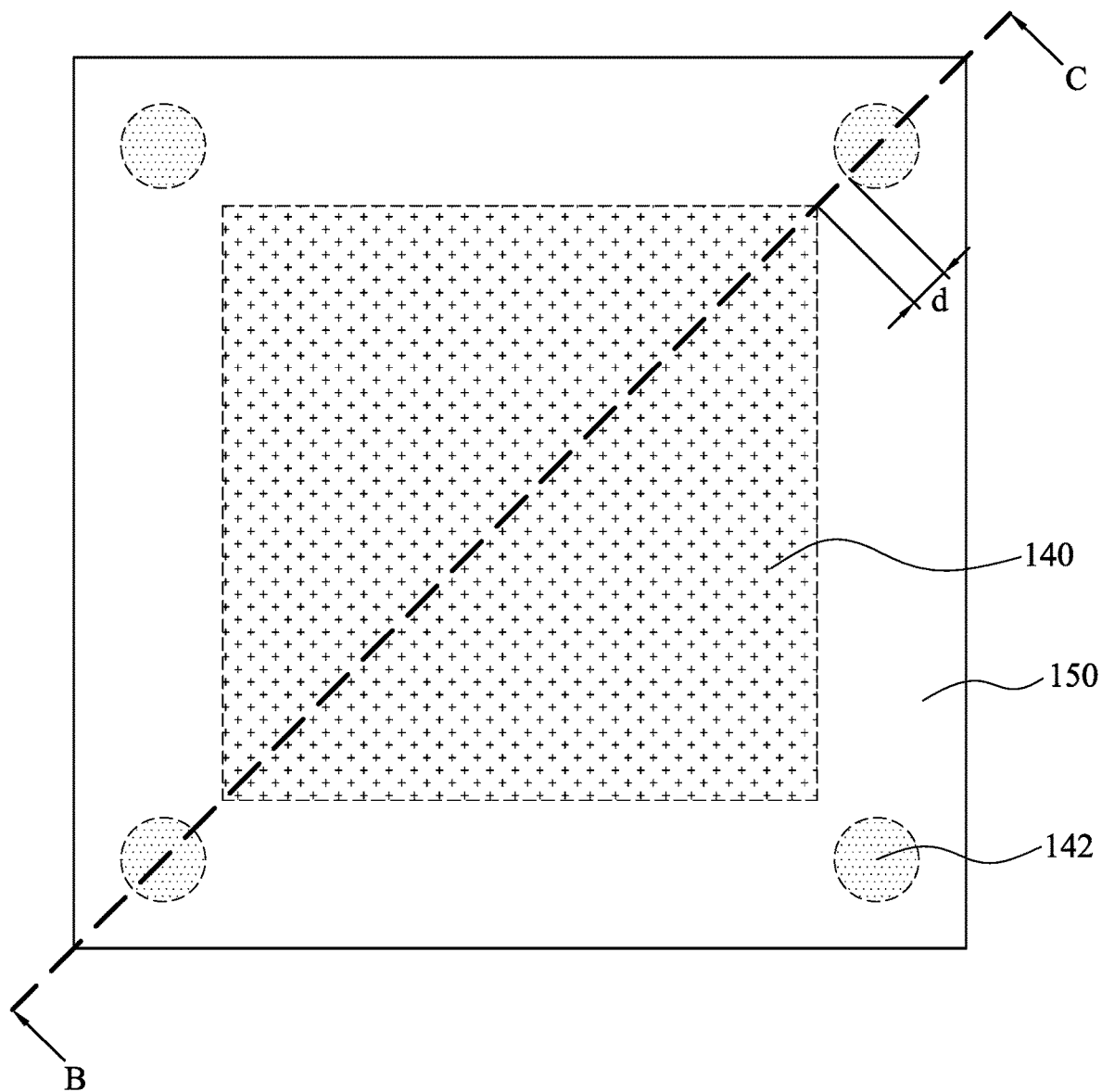
FIG. 1A is a top view diagram of a semiconductor device package with a warpage control structure according some embodiments in this disclosure.

The drawings, schematics and diagrams are illustrative and not intended to be limiting, but are examples of embodiments of the disclosure, are simplified for explanatory purposes, and are not drawn to scale.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It was found that when a flip-chip chip scale package (fcCSP) without attaching a heat spreader lid, a smiling type warpage of the fcCSP was occurred at a high temperature. After attaching a heat spreader lid, the smile warpage of the fcCSP at the high temperature was changed to crying warpage at the high temperature, and the warpage was enlarged. Therefore, the bridging percentage of the BGA balls at the peripheral area of the fcCSP was increased by this enlarged crying warpage.

Figure 1B:
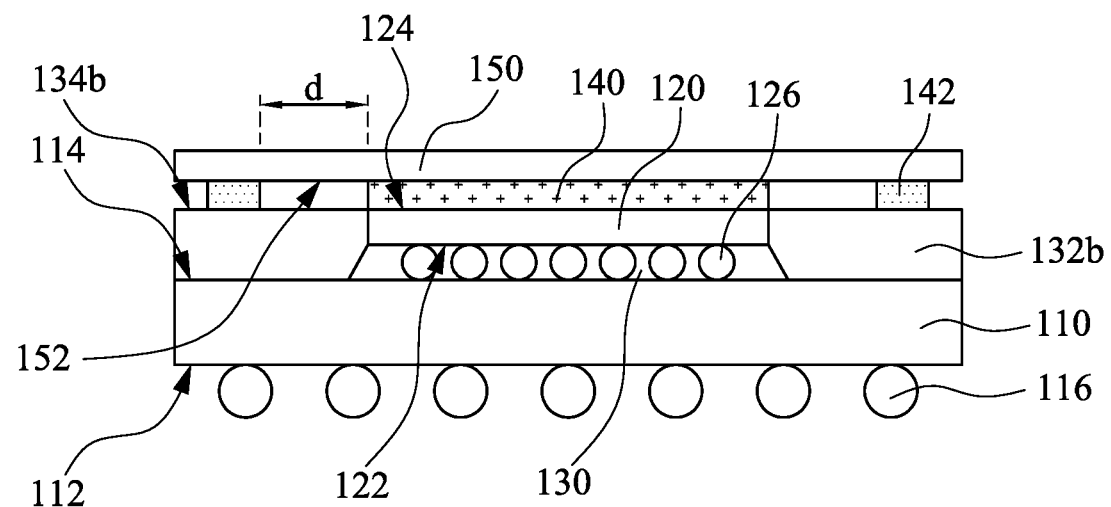
FIGS. 1B and 1C are cross-sectional diagrams of cutting line BC in FIG. 1A.
Figure 1C:
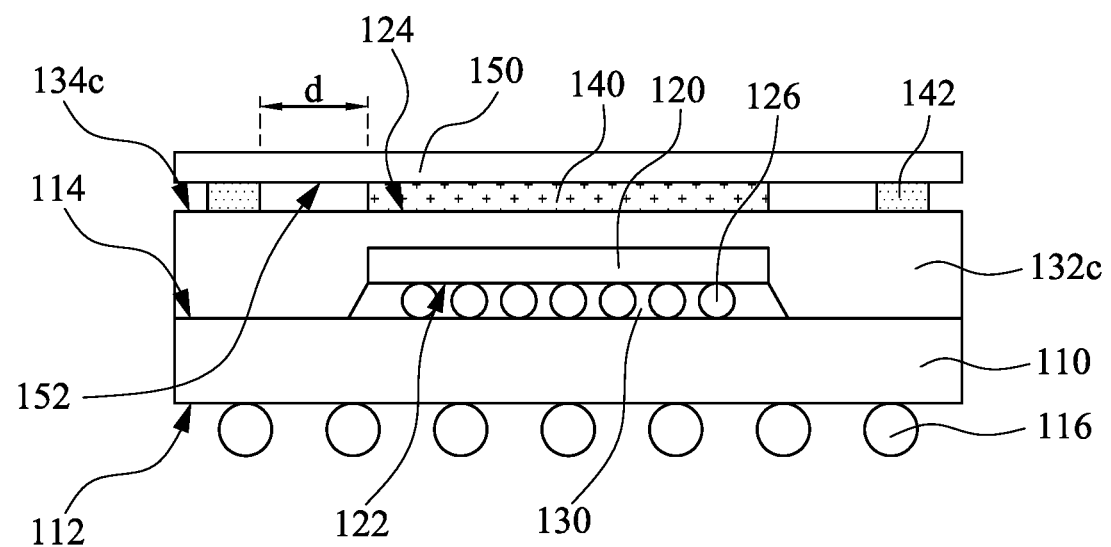

Accordingly, in some embodiments, a semiconductor device package with a warpage control structure is provided in this disclosure to reduce the high stress experienced by bonded various materials in the semiconductor device package during cycles of heating and cooling. FIG. 1A is a top view diagram of a semiconductor device package with a warpage control structure according some embodiments in this disclosure. FIG. 1B or FIG. 1C is a cross-sectional diagram of cutting line BC in FIG. 1A. Accordingly, FIGS. 1A-1C are referred below at the same time.

In a semiconductor device package shown FIGS. 1A-1C, a substrate 110 has a board surface 112 and a die surface 114. On the board surface 112 of the substrate 110, ball grid array (BGA) connectors 116 are disposed for connecting a printed circuit board (not shown in FIGS. 1A-1C).

In some embodiments, the substrate 110 above may be a semiconductor wafer, or a portion of a wafer. The wafer may be silicon, gallium arsenide, silicon on insulator ("SOT") or other similar materials. The wafer may include passive devices such as resistors, capacitors, inductors and the like, or active devices such as transistors. The wafer may also include additional integrated circuits. In some other embodiments, the substrate 110 may be made from some other materials, such as a multiple layer circuit boards made from a bismaleimide-triazine resin (such as a BT-epoxy resin) or glass-reinforced epoxy laminated sheets, for example.

At least one die 120 may be disposed on the die surface 114 of the substrate 110. The die 120 has an active circuit surface 122 and an inactive surface 124. Some solder bumps 126 are disposed on the active circuit surface 122 of the die 120. The die 120 and the substrate 110 are electrically connected by the solder bumps 126.

The solder material of the solder bumps 126 may be lead based or lead free, such as silver, copper, or tin-based compositions. The material of the solder bumps 126 will be eutectics with a common melting point for use in a reflow process. The solder bumps 126 can be plated using electro or electroless plating techniques, or may be formed using screening or jet printing techniques. The solder bumps 126 also may be other types of connectors, such as copper or gold pillars, conductive studs, or C4 columns.

Next, an underfill 130 may be used to mechanically reinforce the connection between the die 120 and the substrate 110. The underfill 130 may be made from a thermoset epoxy resin, which is dispensed into the remaining space (or "gap") between the die 120 and the substrate 110 by a capillary underfill process, for example. The underfill 130 is then cured by heating.

In addition, a molding layer 132b in FIG. 1B can be formed to surround the lateral side of the die 120 to further enhance the mechanical bonding strength between the die 120 and the substrate 110 in some embodiments. In FIG. 1B, the exposed inactive surface 124 of the die 120 and the top surface 134b of the molding layer 132b compose a substantial planar top surface.

Alternatively, a molding layer 132c in FIG. 1C also can be formed to surround the lateral side of the die 120 and cover the inactive surface 124 of the die 120 by overmolding process to further enhance the mechanical bonding strength between the die 120 and the substrate 110 in some other embodiments. In FIG. 1C, the top surface 134c of the molding layer 132c is substantial planar.

The molding layer 132b or the molding layer 132c may be made from a composite material comprises a thermoset epoxy resin (such as bisphenol-A epoxy or Novolac™ epoxy) and a filler (such as silica, alumina or glass fillers) for adjusting a thermal expansion coefficient and elasticity of the composite material. In some embodiments, the content of thermoset epoxy resin may be 25-35 wt %, and the content of the filler may be 65-73 wt %.

Furthermore, a molding underfill process may be used in some other embodiments. Thus, the underfill 130 as well as the molding layer 132b or the molding layer 132c may be formed by one compound material by the molding underfill process.

A sheet of heat spreader lid 150 is further disposed on the top surface of the semiconductor device package, i.e. the top surface composed by the top surface 134b of the molding layer 132b and the inactive surface 124 of the die 120 in FIG. 1B, or the top surface 134c of the molding layer 132c in FIG. 10. The heat spreader lid 150 has an adhesive surface 152, which is substantially planar and faces the top surface of the semiconductor device package described above.

A spreader adhesive layer 140 is disposed between the top surface of the semiconductor device package, as described above, and the adhesive surface 152 of the heat spreader lid 150. The spreader adhesive layer 140 is located on a central area of the adhesive surface 152 of the heat spreader lid 150 (see FIG. 1A) to fix the heat spreader lid 150 onto the top surface of the semiconductor device package.

Since the spreader adhesive layer 140 is responsible to attach the heat spreader lid 150 on to the semiconductor device package, the coverage of the spreader adhesive layer 140 on the adhesive surface 152 of the heat spreader lid 150 cannot be too small. In some embodiments, the coverage of the spreader adhesive layer 140 on the adhesive surface 152 of the heat spreader lid 150 is at least 30%. Oppositely, if the coverage of the spreader adhesive layer 140 on the adhesive surface 152 of the heat spreader lid 150 is too much, problems of glue overflowing and warpage may occur. Therefore, in some embodiments, the coverage of the spreader adhesive layer 140 on the adhesive surface 152 of the heat spreader lid 150 may be at most 80%. Accordingly, In some embodiments, the spreader adhesive 140 covers about 30% to about 80%, such as 30%, 35%, 40%, 45%, 50%, 55%, 60%, 65%, 70%, 75%, or 80%, of the adhesive surface 152. In some other embodiments, the spreader adhesive 140 covers about 40% to about 80% of the adhesive surface 152. In some other embodiments, the spreader adhesive 140 covers about 40% to about 75% of the adhesive surface 152.

In addition, several warpage control adhesive layers 142 are disposed on corner areas of the adhesive surface 152 of the heat spreader lid 150 (see FIG. 1A). The warpage control adhesive layers 142 are separated from the spreader adhesive layer 140 by a distance d. In some embodiments, the distance d may be at least 1 mm. In some other embodiments, the area of the warpage control adhesive layers 142 each may be from about 0.5 mm² to about 100 mm². In some other embodiments, the shape of the warpage control adhesive layers 142 each may be any useful shapes, such as circle, oval, rectangular, donut, or an irregular shape. In some other embodiments, the number of the warpage control adhesive layers 142 disposed on each corner area may be one or more. In some other embodiments, the warpage control adhesive layers 142 may be made from a solder, a resin, or a glue.

Some simulations were done for the pattern composed by the spreader adhesive layer 140 and the warpage control adhesive layers 142 by finite element analysis (FEA) to predict the warpage of the semiconductor device package with a heat spreader lid at 260° C., which is a reflow temperature of the BGA balls. The obtained results are listed in a table shown in FIG. 2A.

Figure 2B:
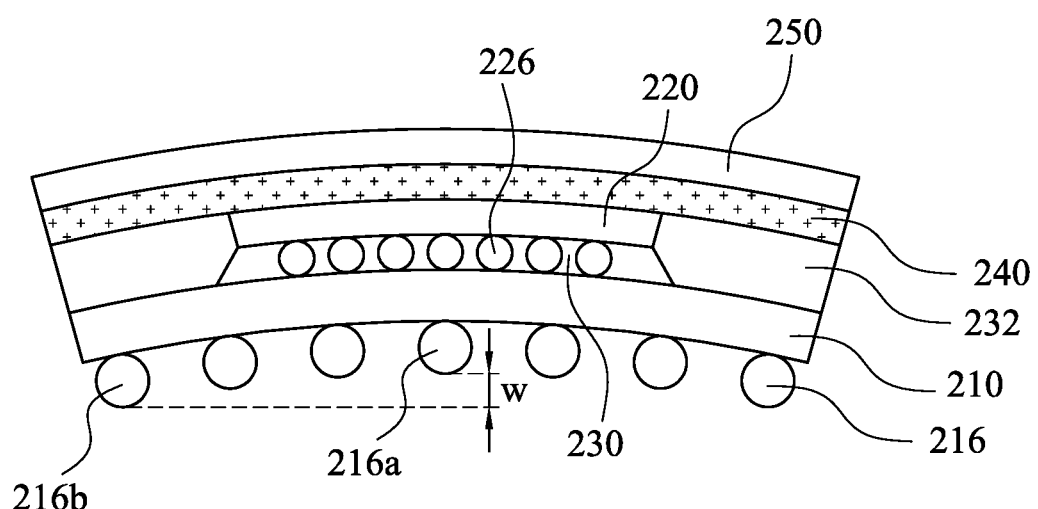
FIG. 2B is a cross-sectional diagram of a warped semiconductor device package with a crying warpage.

FIG. 2B is a cross-sectional diagram of a warped semiconductor device package with a crying warpage. In FIG. 2B, the warped semiconductor device package includes a substrate 210 with BGA balls 216, a die 220 with solder bumps 226, an underfill 230, a molding layer 232, a spreader adhesive layer 240 and a heat spreader lid 250. The warpage w is defined by the level difference between the highest BGA ball 216a and the lowest BGA ball 216b. Accordingly, in the table of FIG. 2A, the predicted warpage at 260° C. of a semiconductor device package with 100% coverage of the spreader adhesive layer (i.e. example CE1) is normalized to 1.00.

In the table of FIG. 2A, the coverage of the spreader adhesive layer on the adhesive surface of a heat spreader lid was varied from 100% to 50% for CE1 to CE4. Along with the decrease of the coverage of the spreader adhesive layer 240 on the adhesive surface of a heat spreader lid, the predicted warpage of the fcCSP at 260° C. was varied from 1.00, 1.11, 1.06, to 0.92. it seems that the decrease of the spreader adhesive layer's coverage can slightly decrease the warpage of the semiconductor device package.

In examples CE5 and CE6, the coverage of the spreader adhesive layer 240 was maintained at 50%, but the corners of the spreader adhesive layer have some extensions 241 extending respectively toward to the corners of the heat spreader lid. The coverage of the extension 241 of CE6 is more than CE5, and the predicted warpage of the CE6 is less than CE5 (0.89 v. 1.00).

Surprisingly, in examples E1 to E3, after the extensions 241 of the spreader adhesive layer 240 in examples CE5 and CE6 were separated from the spreader adhesive layer 240 to form warpage control adhesive layers 242, the predicted warpage can be further decreased (0.81 to 0.87). Therefore, it can be known that the warpage control adhesive layers, which are separated from the spreader adhesive layer, can effectively decrease the predicted warpage of a semiconductor device package at high temperature to effectively decrease bridging percentage of BGA connectors of the semiconductor device package, and the yield can thus be improved as well.

Accordingly, in some embodiments, a warpage control structure of a semiconductor device package with a heat spreader lid is provided. The warpage control structure comprises a plurality of warpage control adhesive layers disposed between a top surface of a molding layer and an adhesive surface of a heat spreader lid as well as on plural corner areas of the adhesive surface of the heat spreader lid. The top surface of the molding layer and the adhesive surface of the heat spreader lid are substantial planar.

In some other embodiments, a warpage control pattern of adhesive layers for attaching an adhesive surface of a heat spreader lid to a top surface of a semiconductor device package is provided. The top surface of the semiconductor device package and the adhesive surface of the heat spreader lid are substantial planar. The warpage control pattern comprises a spreader adhesive layer disposed on a central area of the adhesive surface of the heat spreader lid, and a plurality of warpage control adhesive layers respectively disposed on plural corner areas of the adhesive surface of the heat spreader lid and disposed to be separated from the spreader adhesive layer.

In some other embodiments, a semiconductor device package with a heat spreader lid is also provided. The semiconductor device package comprises a substrate, a die, a molding layer, a heat spreader lid, a spreader adhesive layer, and a plurality of warpage control adhesive layers. The substrate has a die surface and a board surface. The die has an active circuit surface and an inactive surface, and the active circuit surface of the die is electrically and mechanically coupled to the die surface of the substrate. The molding layer is disposed to fill a space above the die surface of the substrate. The molding layer or the molding layer and the inactive surface compose a substantial planar top surface. The heat spreader lid is disposed above the molding layer, wherein the heat spreader lid has a substantial planar adhesive surface. The spreader adhesive layer is disposed between the substantial planar top surface and a central area of the adhesive surface of the heat spreader lid. The warpage control adhesive layers are disposed between the top surface and on plural corner areas of the adhesive surface of the heat spreader lid, and the warpage control adhesive layers are separated from the spreader adhesive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package comprising:
a die over a substrate;
a molding layer surrounding the die;
a heat spreader lid above the substrate;
a spreader adhesive layer between the heat spreader lid and the die, wherein an entire sidewall of the spreader adhesive layer is confined within a top surface of the die; and
a plurality of warpage control adhesive layers respectively attaching a plurality of corner areas of the heat spreader lid to the molding layer and separated from each other, wherein at least one of the warpage control adhesive layers attaching at least one of the corner areas is at a first distance from a first edge of the at least one of the corner areas and at a second distance from a second edge of the at least one of the corner areas.

2. The semiconductor device package of claim 1, wherein an area of the warpage control adhesive layers each is from about 0.5 mm$^2$ to about 100 mm$^2$.

3. The semiconductor device package of claim 1, wherein the warpage control adhesive layers are symmetrically arranged on the corner areas of the heat spreader lid.

4. The semiconductor device package of claim 1, wherein the die is flipped-packaged on the substrate.

5. A semiconductor device package comprising:
a die over a substrate;
a plurality of solder bumps between a die surface of the substrate and the die;
a plurality of ball grid array connectors on a board surface of the substrate opposite the die surface of the substrate;
a molding layer surrounding the die;
a heat spreader lid;
a spreader adhesive layer between the heat spreader lid and the die, wherein an entire sidewall of the spreader adhesive layer is confined within a top surface of the die; and
at least one first warpage control adhesive layer separated from the spreader adhesive layer and attaching a first corner area of the heat spreader lid to the molding layer, wherein the at least one first warpage control adhesive layer is at a distance from a first edge of the first corner area but is in contact with a second edge of the first corner area.

6. The semiconductor device package of claim 5, further comprising at least one second warpage control adhesive layer separated from the spreader adhesive layer and attaching a second corner area of the heat spreader lid to the molding layer.

7. The semiconductor device package of claim 6, wherein a number of the at least one second warpage control adhesive layer is the same as a number of the at least one first warpage control adhesive layer.

8. The semiconductor device package of claim 7, wherein the first and second corner areas are adjacent to each other.

9. The semiconductor device package of claim 7, wherein the first and second corner areas are opposite to each other.

10. The semiconductor device package of claim 5, wherein a periphery of the heat spreader lid that surrounds a central area of the heat spreader lid is free of the spreader adhesive layer.

11. The semiconductor device package of claim 5, wherein the at least one first warpage control adhesive layer is a solder.

12. A semiconductor device package comprising:
a die over a substrate;
a plurality of solder bumps between a die surface of the substrate and the die;
a plurality of ball grid array connectors on a board surface of the substrate opposite the die surface of the substrate;

a molding layer above the die;

a heat spreader lid;

a spreader adhesive layer attaching the heat spreader lid to the molding layer and between the heat spreader lid and the die, wherein an entire sidewall of the spreader adhesive layer is confined within a top surface of the die; and at least one first warpage control adhesive layer separated from the spreader adhesive layer and attaching a first corner area of the heat spreader lid to the molding layer, wherein the at least one first warpage control adhesive layer is at a first distance from a first edge of the heat spreader lid and at a second distance from a second edge of the heat spreader lid, the first edge of the heat spreader lid and a third edge of the heat spreader lid define the first corner area of the heat spreader lid, and the second edge of the heat spreader lid is opposite the third edge of the heat spreader lid.

13. The semiconductor device package of claim 12, further comprising at least one second warpage control adhesive layer separated from the spreader adhesive layer and attaching a second corner area of the heat spreader lid to the molding layer.

14. The semiconductor device package of claim 13, further comprising at least one third warpage control adhesive layer separated from the spreader adhesive layer and attaching a third corner area of the heat spreader lid to the molding layer.

15. The semiconductor device package of claim 13, wherein a number of the at least one second warpage control adhesive layer is different from a number of the at least one first warpage control adhesive layer.

16. The semiconductor device package of claim 15, wherein the first and second corner areas are adjacent to each other.

17. The semiconductor device package of claim 15, wherein the first and second corner areas are opposite to each other.

18. The semiconductor device package of claim 12, wherein the first edge and the second edge of the heat spreader lid define a second corner area of the heat spreader lid.

19. The semiconductor device package of claim 12, wherein a fourth edge of the heat spreader lid is opposite the first edge of the heat spreader lid.

20. The semiconductor device package of claim 12, wherein the at least one first warpage control adhesive layer is at a third distance from a second corner area of the heat spreader lid, at a fourth distance from a third corner area of the heat spreader lid, and at a fifth distance from a fourth corner area of the heat spreader lid.

* * * * *